United States Patent
Harada et al.

(10) Patent No.: US 9,425,039 B2
(45) Date of Patent: Aug. 23, 2016

(54) METHOD OF MANUFACTURING SEMICONDUCTOR DEVICE, SUBSTRATE PROCESSING APPARATUS AND NON-TRANSITORY COMPUTER-READABLE RECORDING MEDIUM

(71) Applicant: HITACHI KOKUSAI ELECTRIC INC., Tokyo (JP)

(72) Inventors: Kazuhiro Harada, Toyama (JP); Arito Ogawa, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/666,969

(22) Filed: Mar. 24, 2015

(65) Prior Publication Data
US 2015/0279663 A1   Oct. 1, 2015

(30) Foreign Application Priority Data
Mar. 26, 2014 (JP) ................ 2014-064064

(51) Int. Cl.
*H01L 21/31*    (2006.01)
*H01L 21/469*   (2006.01)
*H01L 21/02*    (2006.01)
*C23C 16/34*    (2006.01)
*C23C 16/455*   (2006.01)
*H01L 21/28*    (2006.01)
*H01L 29/49*    (2006.01)

(52) U.S. Cl.
CPC ......... *H01L 21/02186* (2013.01); *C23C 16/34* (2013.01); *C23C 16/45527* (2013.01); *C23C 16/45531* (2013.01); *H01L 21/02205* (2013.01); *H01L 21/02271* (2013.01); *H01L 21/28088* (2013.01); *H01L 29/4966* (2013.01)

(58) Field of Classification Search
CPC ............... H01L 21/31; H01L 21/469; H01L 21/28008; H01L 29/4966; H01L 21/02186; H01L 21/02205

USPC ................................................. 438/592, 785
See application file for complete search history.

(56) References Cited

U.S. PATENT DOCUMENTS

| | | | |
|---|---|---|---|
| 2005/0260812 A1 | 11/2005 | Kapteyn et al. | |
| 2006/0237796 A1 | 10/2006 | Cartier et al. | |
| 2011/0003482 A1* | 1/2011 | Ogawa ................ | C23C 16/303 438/763 |
| 2011/0163452 A1 | 7/2011 | Horii et al. | |
| 2013/0221445 A1 | 8/2013 | Lei et al. | |
| 2014/0084389 A1* | 3/2014 | Ogawa ................ | C23C 16/403 257/411 |
| 2014/0242790 A1* | 8/2014 | Harada ............. | H01L 21/28008 438/592 |
| 2015/0171179 A1* | 6/2015 | Horii ................. | H01L 29/4966 257/761 |

FOREIGN PATENT DOCUMENTS

JP   2011-006783   1/2011

OTHER PUBLICATIONS

Korean Notification of Reason for Refusal, KR Application No. 10-2015-0033862, Dec. 1, 2015, 4 pages (English translation provided).

* cited by examiner

*Primary Examiner* — Phuc Dang
(74) *Attorney, Agent, or Firm* — Volpe and Koenig, P.C.

(57) ABSTRACT

Provided is a technique of controlling a work function of a metal film. A composite metal nitride film is formed on a substrate present in a process chamber by alternately supplying a first source and a second source to the substrate, wherein the first source contains a first metal element, the second source contains an ethyl ligand and a second metal element that is different from the first metal element, and a bond between the second metal element and a nitrogen element in the composite metal nitride film has crystallinity.

6 Claims, 13 Drawing Sheets

METHOD OF MANUFACTURING SEMICONDUCTOR DEVICE, SUBSTRATE PROCESSING APPARATUS AND NON-TRANSITORY COMPUTER-READABLE RECORDING MEDIUM

CROSS-REFERENCE TO RELATED PATENT APPLICATION

This U.S. non-provisional patent application claims priority under 35 U.S.C. §119 of Japanese Patent Application No. 2014-064064, filed on Mar. 26, 2014, in the Japanese Patent Office, the whole contents of which are hereby incorporated by reference.

BACKGROUND OF THE INVENTION

1. Field of the Invention

The present invention relates to a method of manufacturing a semiconductor device, a substrate processing apparatus and a non-transitory computer-readable recording medium.

2. Description of the Related Art

Various types of metal films are used in transistor gate electrodes such as a metal-oxide-semiconductor field effect transistor (MOSFET) or capacitor electrodes of a dynamic random access memory (DRAM).

A gate stack structure in which a high-k film is formed on a substrate and a gate electrode is formed on the high-k film has been known as an example of a transistor structure. A metal nitride film, e.g., a titanium nitride (TiN) film, has been widely employed as a gate electrode (see, for example, Patent document 1).

RELATED ART DOCUMENT

Patent Document

1. Japanese Unexamined Patent Application Publication No. 2011-6783

SUMMARY OF THE INVENTION

A work function varies according to the desired performance of a device. For example, a metal film having a lower work function than that of a TiN film is required to decrease power consumption in an NMOS type transistor. As described above, a required work function varies according to the desired performance of a device and thus a work function of a metal film is required to be controlled.

It is a main object of the present invention to provide a technique of controlling a work function of a metal film.

According to one aspect of the present invention, there is provided a technique including (a) supplying a first metal source including a first metal element to a substrate accommodated in a process chamber and exhausting the first metal source from the process chamber; (b) supplying a second metal source including an ethyl ligand and a second metal element different from the first metal element to the substrate and exhausting the second metal source from the process chamber; and (c) supplying a reactive gas containing nitrogen to the substrate and exhausting the reactive gas containing nitrogen from the process chamber, wherein (a) through (c) are repeated a plurality of times to form a metal nitride film including the first metal element, a second metal element and nitrogen.

DETAILED DESCRIPTION OF THE PREFERRED EMBODIMENTS

First Embodiment

A first embodiment of the present invention will now be described with reference to the accompanying drawings.

First, a substrate processing apparatus employed in the present embodiment will be described. In detail, the substrate processing apparatus is a semiconductor device manufacturing apparatus and is used in a process of a semiconductor device manufacturing process.

In the following description, a case in which a single-wafer type substrate processing apparatus capable of forming a film on one substrate at a time is used as an example of a substrate processing apparatus will be described.

(1) Structure of Substrate Processing Apparatus

First, a schematic configuration diagram of a substrate processing apparatus employed in the present embodiment will be described below.

Process Chamber

Figure 1:
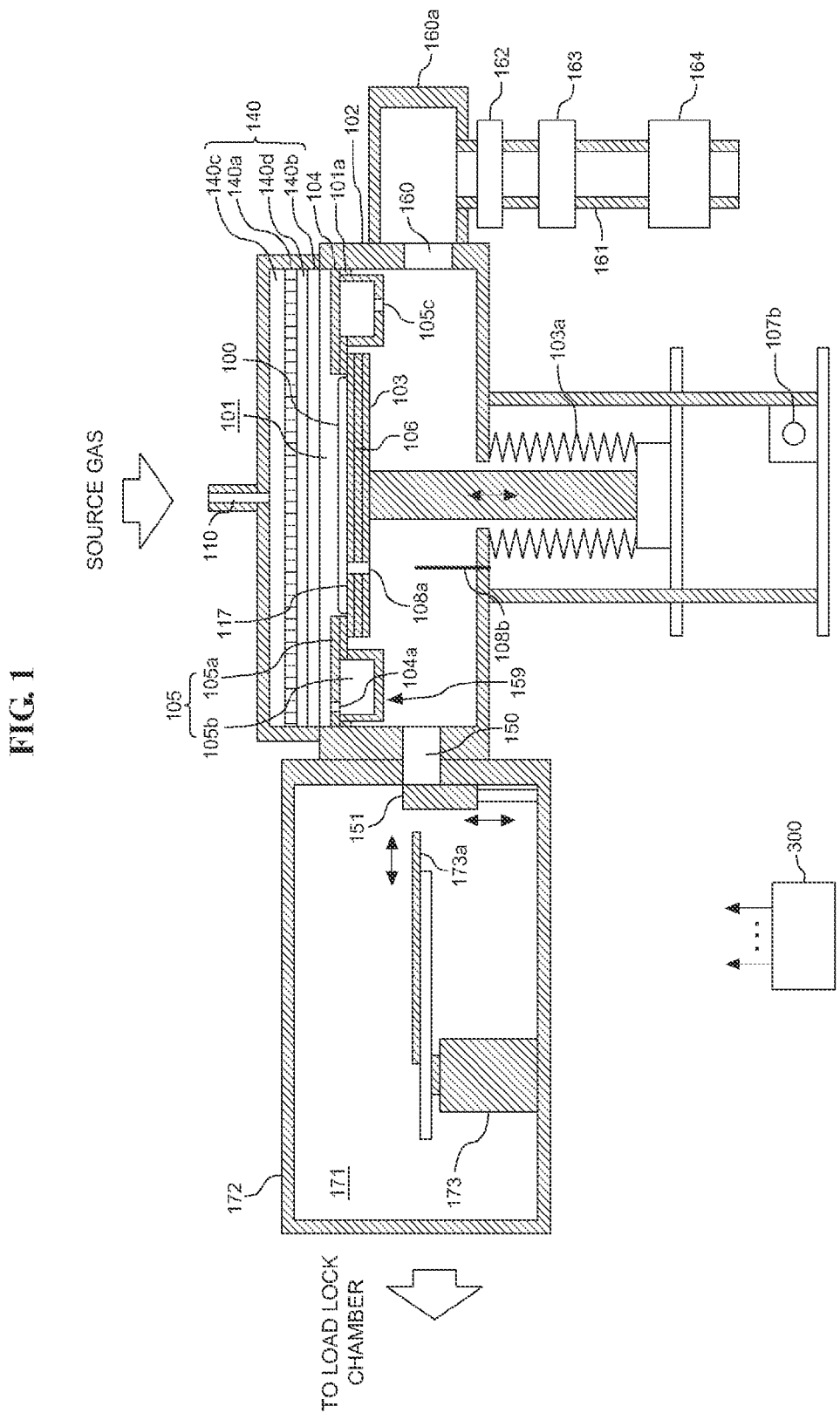
FIG. 1 is a schematic configuration diagram of a substrate processing apparatus according to a first embodiment of the present invention.

As illustrated in FIG. 1, the substrate processing apparatus according to the present embodiment includes a process container 102. The process container 102 is configured, for example, as a flat air-tight container that is round in a top view. The process container 102 is formed of, for example, a metal material such as aluminum (Al) or stainless steel (SUS), quartz ($SiO_2$), etc. In the process container 102, a process chamber 101 is formed. In the process chamber 101, a wafer 100, e.g., a silicon wafer, which serves as a substrate is processed.

Support

In the process container 102, a support 103 is installed to support the wafer 100. The support 103 is formed of for example, quartz ($SiO_2$), carbon, ceramics, silicon carbide (SiC), aluminum oxide ($Al_2O_3$) or aluminum nitride (AlN). A susceptor 117 formed of, for example, quartz ($SiO_2$), carbon, ceramics, silicon carbide (SiC), aluminum oxide ($Al_2O_3$) or aluminum nitride (AlN) is installed as a support table on a top surface of the support 103. The wafer 100 is placed on the susceptor 117. A heater 106 serving as a heating unit (heating source) for heating the wafer 100 is embedded in the support 103. Also, a lower end portion (pillar) of the support 103 passes through a lower portion of the process container 102.

Lifting Mechanism

A lifting mechanism 107b connected to the lower end portion of the support 103 is installed outside the process container 102. By operating the lifting mechanism 107b, the support 103 is moved up or down to move the wafer 100 supported on the susceptor 117 upward or downward. The support 103 (the susceptor 117) is moved down to the height of a wafer transfer port 150 (which will be described below) so as to transfer the wafer 100, and is moved up to a wafer processing position as illustrated in FIG. 1 so as to process the wafer 100. The vicinity of the lower end portion of the support 103 is covered with bellows 103a and the inside of the process container 102 is maintained in an airtight state.

Lifter Pin

A plurality of lifter pins 108b, e.g., three lifter pins 108b, are installed on a lower surface (bottom surface) of the process container 102. Through-holes 108a are installed at locations on the support 103 (including the susceptor 117) corresponding to the lifter pins 108b to pass through the through-holes 108a. When the support 103 is moved down to a wafer transfer position, top ends of the lifter pins 108b protrude from a top surface of the susceptor 117 via the through-holes 108a, so that the wafer 100 may be supported from below by the lifter pins 108b. Also, when the support 103 is moved up to the wafer processing position, the lifter pin 108b is buried from the top surface of the susceptor 117, so that the wafer 100 may be supported from below by the susceptor 117. The lifter pins 108b are directly in contact with the wafer 100 and are thus preferably formed of quartz, alumina, etc.

Wafer Transfer Port

The wafer transfer port 150 is installed on a side surface of an inner wall of the process container 102 to transfer the wafer 100 to the inside or outside of the process container 102. A gate valve 151 installed at the wafer transfer port 150. When the gate valve 151 is opened, the inside of the process container 102 and the inside of a transfer chamber (spare chamber) 171 are communicated with each other. The transfer chamber 171 is formed in a transfer container (airtight container) 172 and a transfer robot 173 is installed in the transfer chamber 171 to transfer the wafer 100. The transfer robot 173 includes a transfer arm 173a to support the wafer 100 when the wafer 100 is transferred. When the gate valve 151 is opened in a state in which the support 103 is moved down to the wafer transfer position, the wafer 100 may be transferred between the inside of the process chamber 101 and the inside of the transfer chamber 171 through the transfer robot 173. The wafer 100 transferred into the process chamber 101 is temporarily placed on the lifter pin 108b as described above. A load lock chamber (not shown) is installed at a side of the transfer container 172 opposite the side of the transfer container 172 at which the wafer transfer port 150 is installed. The wafer may be transferred between the inside of the load lock chamber and the inside of the transfer chamber 171 through the transfer robot 173. The load lock chamber may also act as a spare chamber configured to temporarily accommodate a non-processed wafer 100 or a processed wafer 100.

Exhaust System

An exhaust port 160 configured to exhaust an atmosphere in the process container 102 is installed at a side surface of an inner wall of the process container 102 opposite the wafer transfer port 150. An exhaust pipe 161 is connected to the exhaust port 160 via an exhaust chamber 160a. A pressure adjustment unit 162 such as an auto pressure controller (APC) which serves as a pressure control device for controlling a pressure in the process chamber 101 to have a predetermined pressure, a source collecting trap 163 and a vacuum pump 164 are sequentially connected in series to the exhaust pipe 161. An exhaust system (exhaust line) mainly includes the exhaust port 160, the exhaust pipe 161 and the pressure adjustment unit 162. The source collecting trap 163 and the vacuum pump 164 are installed in a semiconductor manufacturing process in which the substrate processing apparatus is installed but may be installed in the substrate processing apparatus.

Gas Inlet

A gas inlet 110 is installed at an upper portion of the process container 102 [a top surface (ceiling wall) of a shower head 140 which will be described below] to supply various gases into the process container 102. A gas supply system (which will be described below) is connected to the gas inlet 110.

Shower Head

In the process container 102, the shower head 140 is installed as a gas dispersion mechanism between the gas inlet 110 and the process chamber 101. The shower head 140 includes a dispersion plate 140a that disperses a gas introduced via the gas inlet 110, and a shower plate 140b that more uniformly disperses the gas passing through the dispersion plate 140a to be supplied to a surface of the wafer 100 on the support 103. A plurality of air vents are installed in the dispersion plate 140a and the shower plate 140b. The dispersion plate 140a is disposed to face the top surface of the shower head 140 and the shower plate 140b. The shower plate 140b is disposed to face the wafer 100 on the support 103. A space is formed between the top surface of the shower head 140 and the dispersion plate 140a, and a space is formed between the dispersion plate 140a and the shower plate 140b. These spaces act as a first buffer space 140c configured to diffuse a as supplied via the gas inlet 110 and a second buffer space 140d configured to diffuse a gas passing through the dispersion plate 140a.

Exhaust Duct

A stepped portion 101a is formed on a side surface of an inner wall of the process chamber 101. The stepped portion 101a supports a conductance plate 104. The conductance plate 104 is a ring-shaped board having an inner circumferential portion with an opening for accommodating the wafer 100. A plurality of outlets 104a are arranged in an outer circumferential portion of the conductance plate 104 in a main direction at predetermined intervals.

In the process container 102, a lower plate 105 is locked into an outer circumferential portion of the support 103. The lower plate 105 includes a ring-shaped concave portion 105b and a flange portion 105a formed integrally with an upper inner circumferential portion the concave portion 105b. The concave portion 105b is installed to block a gap between the outer circumferential portion of the support 103 and the side surface of the inner wall of the process chamber 101. A plate exhaust port 105c is installed on a part of a bottom portion of the concave portion 105b near the exhaust port 160 to discharge (circulate) a gas from the inside of the concave portion 105b to the exhaust port 160. The flange portion 105a functions as a lock unit to be locked into an upper peripheral portion of the support 103. Since the flange portion 105a is locked into the upper peripheral portion of the support 103, the lower plate 105 is moved up or down with the support 103 when the support 103 is moved up or down.

When the support 103 is moved up to the wafer processing position, the conductance plate 104 blocks an upper opening of the concave portion 105b of the lower plate 105, and an exhaust duct 159 that uses the inside of the concave portion 105b as a gas channel region is formed. Also, the conductance plate 104 and the lower plate 105 are preferably formed of a high-temperature retaining material, e.g., high-temperature resistant and high-load resistant quartz, considering a case in which a reactive product deposited on an inner wall of the exhaust duct 159 is etched (a case in which self-cleaning is performed).

The flow of a gas in the process chamber 101 when the wafer 100 is processed will now be described. First, a gas supplied into the shower head 140 via the gas inlet 110 flows into the second buffer space 140d through an opening in the dispersion plate 140a via the first buffer space 140c, is supplied into the process chamber 101 through an opening in the shower plate 140b, and is then uniformly supplied onto the wafer 100. The gas supplied onto the wafer 100 radially flows outward. A residual gas that has been in contact with the wafer 100 radially flows outward on the exhaust duct 159 on the outer circumferential portion of the wafer 100, i.e., on the conductance plate 104, and is discharged into the gas channel region (the concave portion 105b) included in the exhaust duct 159 via the outlets 104a of the conductance plate 104. Then, the gas flows in the exhaust duct 159, flows through the plate exhaust port 105c, and is then exhausted to the exhaust port 160. By supplying a gas as described above, the gas may be suppressed from flowing back to the bottom of the process chamber 101, i.e., a back surface of the support 103 or a bottom surface of the process chamber 101.

Gas Supply System

Figure 2:
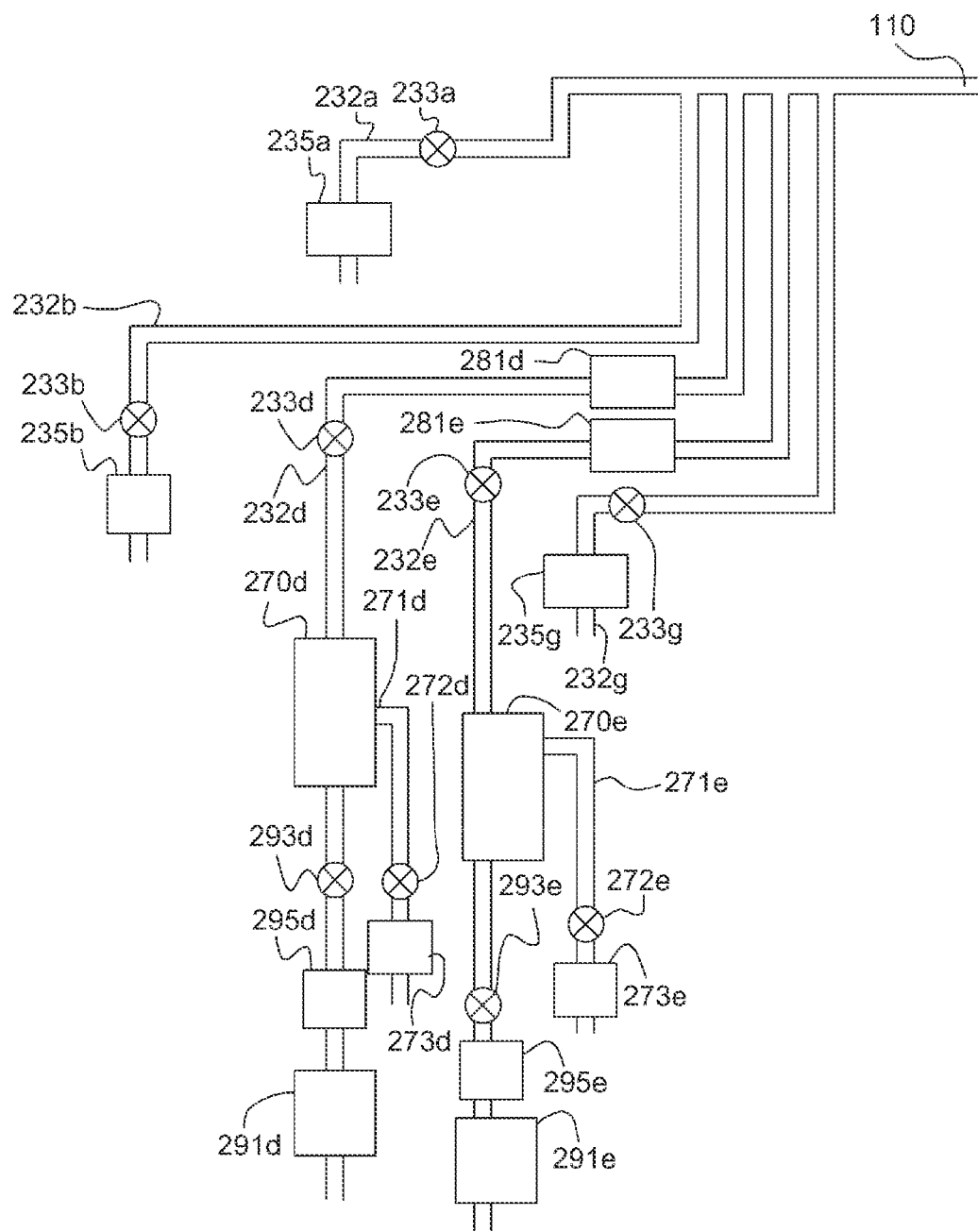
FIG. 2 is a schematic configuration diagram of a gas supply system of the substrate processing apparatus of FIG. 1.

Next, a structure of the gas supply system connected to the gas inlet 110 will be described with reference to FIG. 2. FIG. 2 is a schematic configuration diagram of the gas supply system of the substrate processing apparatus of FIG. 1.

Inert Gas Supply System

A mass flow controller (MFC) 235a serving as a flow rate controller and a valve 233a are sequentially installed at a gas supply pipe 232a from an upstream end. For example, nitrogen ($N_2$) gas which is an inert gas is supplied to the gas inlet 110 via the gas supply pipe 232a. A first inert gas supply system mainly includes the gas supply pipe 232a, the MFC 235a and the valve 233a.

A MFC 235g and a valve 233g are sequentially installed at a gas supply pipe 232g from the upstream end. For example, $N_2$ gas which is an inert gas is supplied into the gas inlet 110 via the gas supply pipe 232g. A second inert, gas supply system mainly includes the gas supply pipe 232g, the MFC 235g and the valve 233g.

An inert gas supply system includes one or both of the first inert, gas supply system and the second inert gas supply system. Also, the first and second inert gas supply systems may be separately used according to a manner of processing the wafer 100.

Source Supply System

A vaporizer 270d is installed at a gas supply pipe 232d. A liquid source tank 291d, a liquid mass flow controller (LMFC) 295d serving as a liquid flow rate controller and a valve 293d are sequentially installed at an upstream side of the vaporizer 270d from the upstream end. A supply rate of a liquid source into the vaporizer 270d (i.e. a supply flow rate of a gas vaporized in the vaporizer 270d and supplied into the process chamber 101) is controlled by the LMFC 295d. A first source supply system mainly includes the gas supply pipe 232d, the LMFC 295d and the valve 293d. The liquid source tank 291d may be further included in the first source supply system. Also, as will be described below; the first source supply system may act as a third source supply system.

A vaporizer 270e is installed at a gas supply pipe 232e. A liquid source tank 291e, an LMFC 295e and a valve 293e are sequentially installed at an upstream side of the vaporizer 270e from the upstream end. A supply rate of a liquid source into the vaporizer 270e (i.e., a supply flow rate of a gas vaporized in the vaporizer 270e and supplied into the process chamber 101) is controlled by the LMFC 295e. A second source supply system mainly includes the gas supply pipe 232e, the LMFC 295e and the valve 293e. The liquid source tank 291e may be further included in the second source supply system.

An inert gas serving as a carrier gas is supplied into the vaporizer 270d via a gas supply pipe 271d. An MFC 273d and a valve 272d are installed at the gas supply pipe 271d. By diluting a vaporized gas generated by the vaporizer 270d using a carrier gas, the process uniformity of the wafer 100 such as film thickness uniformity within a plane of the wafer 100 placed on the susceptor 117 may be controlled. A first carrier gas supply system mainly includes the gas supply pipe 271d, the MFC 273d and the valve 272d. For example, nitrogen ($N_2$) gas is used as an inert gas. Also, a rare gas such as argon (Ar) gas, helium (He) gas, neon (Ne) gas, xenon (Xe) gas may be used as the inert gas.

An inert gas ($N_2$ gas) is supplied as a carrier gas into the vaporizer 270e via a gas supply pipe 271e. An MFC 273e and a valve 272e are installed at the gas supply pipe 271e. By diluting a vaporized gas generated by the vaporizer 270e using a carrier gas, the process uniformity of the wafer 100 such as film thickness uniformity within a plane of the wafer 100 placed on the susceptor 117 may be controlled. A second carrier gas supply system mainly includes the gas supply pipe 271e, the MFC 273e and the valve 272e.

A first source containing a metal element (first metal element) and a halogen element is supplied into the process chamber 101 through the gas supply pipe 232d via the LMFC 295d, the vaporizer 270d, a gas filter 281d, etc. In the present embodiment, titanium (Ti) which is a transition metal element is selected as the metal element and chlorine (Cl) is selected as the halogen element. Here, titanium tetrachloride ($TiCl_4$) is used as a source containing Ti and Cl. $TiCl_4$ is in a liquid state at room temperature and pressure. $TiCl_4$ that is in a liquid state is stored in the liquid source tank 291d. Although Ti which is a transition metal element is used as the metal element here, the present invention is not limited thereto and the metal element may be selected from the transition metal group consisting of tungsten (W), tantalum (Ta), zirconium (Zr), hafnium (Hf), ruthenium (Ru), cobalt (Co) and nickel (Ni). For example, tungsten fluoride ($WF_5$), tantalum chloride ($TaCl_5$), zirconium chloride ($ZrCl_4$), hafnium chloride ($HfCl_4$), tungsten chloride ($WCl_6$), etc. may be used as a source containing the transition metal element and the halogen element. Otherwise, a metal element other than a transition metal may be used. Also, the first source may be used as a third source as will be described below.

A source containing a metal element (second metal element) and an ethyl ligand is supplied into the process chamber 101 through the gas supply pipe 232e via the LMFC 295e, the vaporizer 270e, a gas filter 281e, etc. The second metal element is different from the first metal element. In the present embodiment, hafnium (Hf) which is a transition metal element is used as the second metal element. Here, tetrakis(diethylamino)hafnium (TDEAHf, $Hf(N(C_2H_5)_2)_4$) is used as a source containing Hf and an ethyl ligand. TDEAHf is in a liquid state at room temperature and pressure. TDEAHf that is in a liquid state is stored in the liquid source tank 291e.

Although Hf which is a transition metal element is used as the second metal element here, the present invention is not limited thereto and the second metal element may be selected from the transition metal group consisting of tungsten (W), tantalum (Ta), zirconium (Zr), hafnium (Hf), ruthenium (Ru), cobalt (Co) and nickel (Ni). Otherwise, a metal element other than a transition metal may be used. However, a metal element that is different from the first metal element is selected and a source containing an ethyl ligand is used. For example, tetrakis(diethylamino)zirconium ($Zr(N(C_2H_5)_2)_4$, tris-diethylamino(tertiarybutylimino)tantalum (TBTDET), etc. may be used as a source containing the metal element and the ethyl ligand.

An MFC 235b and a valve 233b are sequentially installed at a gas supply pipe 232b from the upstream end. A reactive gas supply system mainly includes the gas supply pipe 232b, the MFC 235b and the valve 233b. A fourth source containing nitrogen is supplied into the process chamber 101 through the gas supply pipe 232b via the MFC 235b and the valve 233b. Here, ammonia ($NH_3$) is used as the fourth source containing nitrogen. However, the fourth source is not limited to $NH_3$, and $N_2$, nitrous oxide (NO), nitrogen oxide ($N_2O$), etc. may be used.

Control Unit

Figure 3:
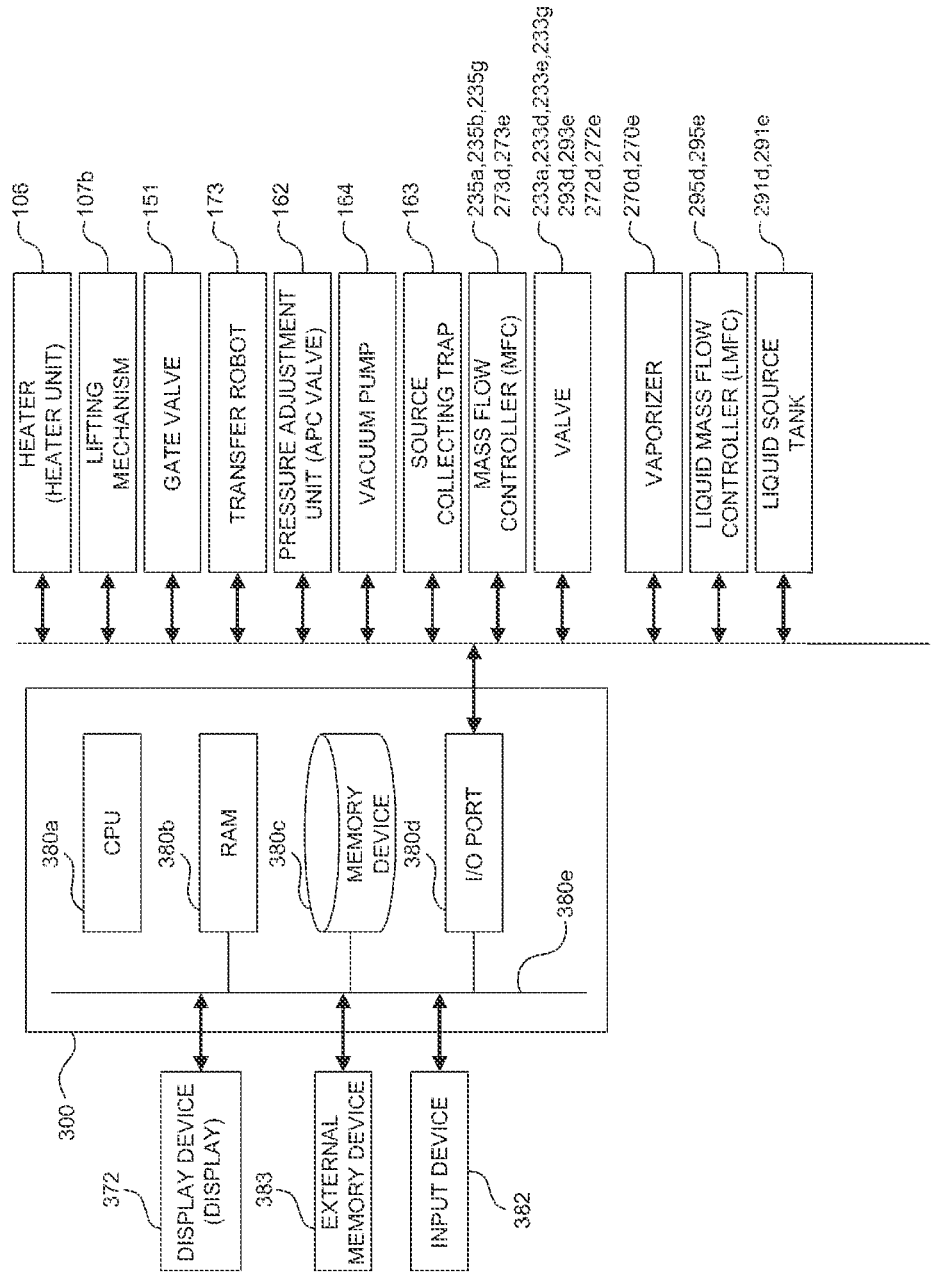
FIG. 3 is a schematic configuration diagram of a controller of the substrate processing apparatus of FIG. 1.

As illustrated in FIG. 1, the substrate processing apparatus includes a controller 300 as a control unit. FIG. 3 illustrates a case in which a control unit according to the present embodiment and various components are connected. The controller 300 which is a control unit (control means) is configured as a computer including a central processing unit (CPU) 380a, a random access memory (RAM) 380b a memory device 380c and an input/output (I/O) port 380d. The RAM 380b, the memory device 380c and the I/O port 380d are configured to exchange data with the CPU 380a via an internal bus 380e. An input device 382, e.g. a touch panel, which serves as a man machine interface (MMI) or a display device (display) 372 are connected to the controller 300.

For example, the memory device 380c includes a flash memory, a hard disk drive (HDD), etc. In the memory device 380e, a control program for controlling an operation of the substrate processing apparatus, a process recipe including an order or conditions of substrate processing which will be described below are stored to be readable. The process recipe is a combination of sequences of a substrate processing process which will be described below to obtain a desired result when the sequences are performed by the controller 300, and acts as a program. Hereinafter, the process recipe, the control program, etc. will also be referred to together simply as a "program." When the term "program" is used in the present disclosure, it should be understood as including only the process recipe, only the control program or both of the process recipe and the control program. The RAM 380b is configured as a memory area (work area) in which a program or data read by the CPU 380a is temporarily stored.

The I/O port 380d is connected to the heater 106, the lifting mechanism 107b, the gate valve 151, the transfer robot 173, the pressure adjustment unit 162, the vacuum pump 164, the source collecting trap 163, the MFCs 235a, 235b, 235g, 273d and 273e, the valves 233a, 231d, 233e, 233g, 293d, 293e, 272d and 272e, the vaporizers 270d and 270e, the LMFCs 295d and 295e, the liquid source tanks 291d and 291e, etc.

The CPU 380a is configured to read a process recipe from the memory device 380c according to a manipulation command, etc. which is input via the input device 382 while reading and executing a control program stored in the memory device 380c. Also, based on the read control program and process recipe, the CPU 380a is configured to control the flow rates of various gases using the MFCs 235a, 235b, 235g, 273d and 273e; control the flow rate of a liquid source using the LMFCs 295d and 295e; control opening/closing of the valves 233a, 233d, 233e, 233g, 293d, 293e, 272d and 272e; control pressure adjustment using the pressure adjustment unit 162; control temperature adjustment using the heater 106; control driving and stopping of the vacuum pump 164;

control upward/downward movement of the support 103 using the lifting mechanism 107b, etc.

The controller 300 is not limited to a dedicated computer and may be configured as a general-purpose computer. For example, the controller 300 according to the present embodiment may be configured by preparing an external memory device 383 storing the above-described program, e.g., a magnetic tape, a magnetic disk (e.g., a flexible disk, a hard disk, etc.), an optical disc (e.g., a compact disc (CD), a digital versatile disc (DVD), etc.), a magneto-optical (MO) disc or a semiconductor memory (e.g., a Universal Serial Bus (USB) memory, a memory card, etc.), and then installing the program in a general-purpose computer using the external memory device 383. Also, a means for supplying the program to a computer is not limited to using the external memory device 383. For example, the program may be supplied to a computer using a communication means, e.g., the Internet or an exclusive line, without using the external memory device 383. The memory device 380c or the external memory device 383 may be configured as a non-transitory computer-readable recording medium. Hereinafter, the memory device 380c and the external memory device 383 may also be referred to together simply as a "recording medium." When the term "recording medium" is used in the present disclosure, it may be understood as only the memory device 380c, only the external memory device 383 or both of the memory device 380c and the external memory device 383.

Structure of Semiconductor Device

Next, a structure of a gate of a transistor (semiconductor device) formed using the substrate processing apparatus described above will be described below. Here, an NMOS type transistor will be described as an example.

Figure 4:
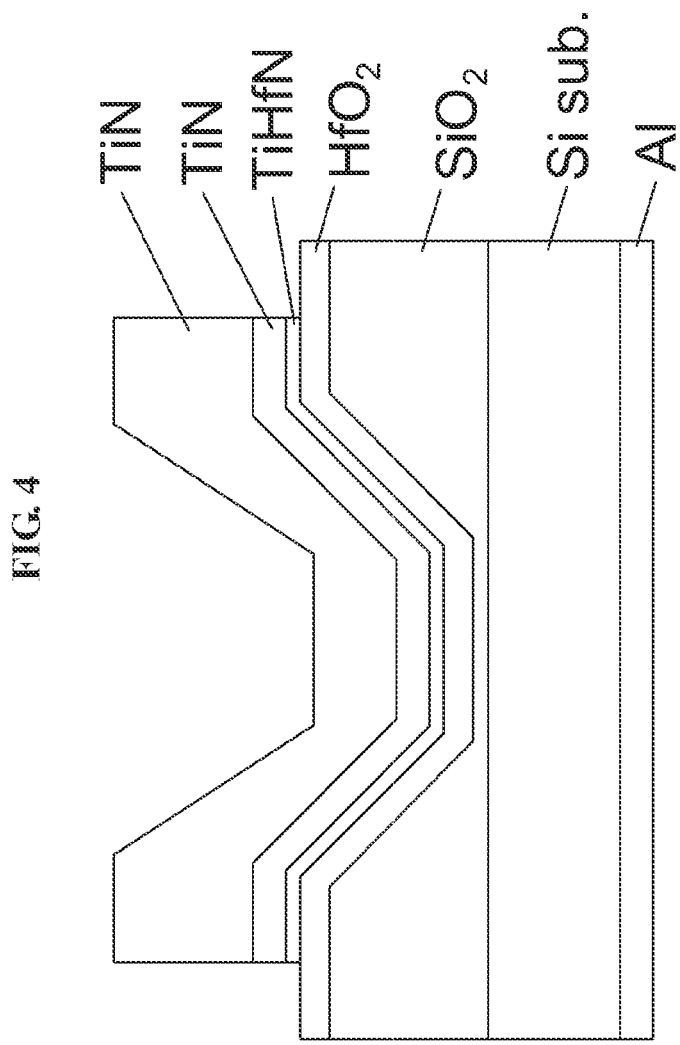
FIG. 4 illustrate an example transistor gate formed using the substrate processing apparatus of FIG. 1.

FIG. 4 illustrate an example transistor gate formed using the substrate processing apparatus described above. In detail, FIG. 4 illustrates a structure of an NMOS type transistor gate. As illustrated in FIG. 4, a gate has a stack structure in which a silicon-based insulating film formed on a silicon (Si) substrate using silicon oxide ($SiO_2$), a high-k film formed on the silicon-based insulating film using hafnium oxide ($HfO_2$) and a gate electrode formed on the high-k film using a composite metal nitride film (TiHfN) are stacked. Also, a capping film is formed on the TiHfN gate using a metal nitride film (TiN). An aluminum (Al) film is formed on a back surface of the silicon substrate.

Process of Manufacturing Gate of Semiconductor Device

Figure 5:
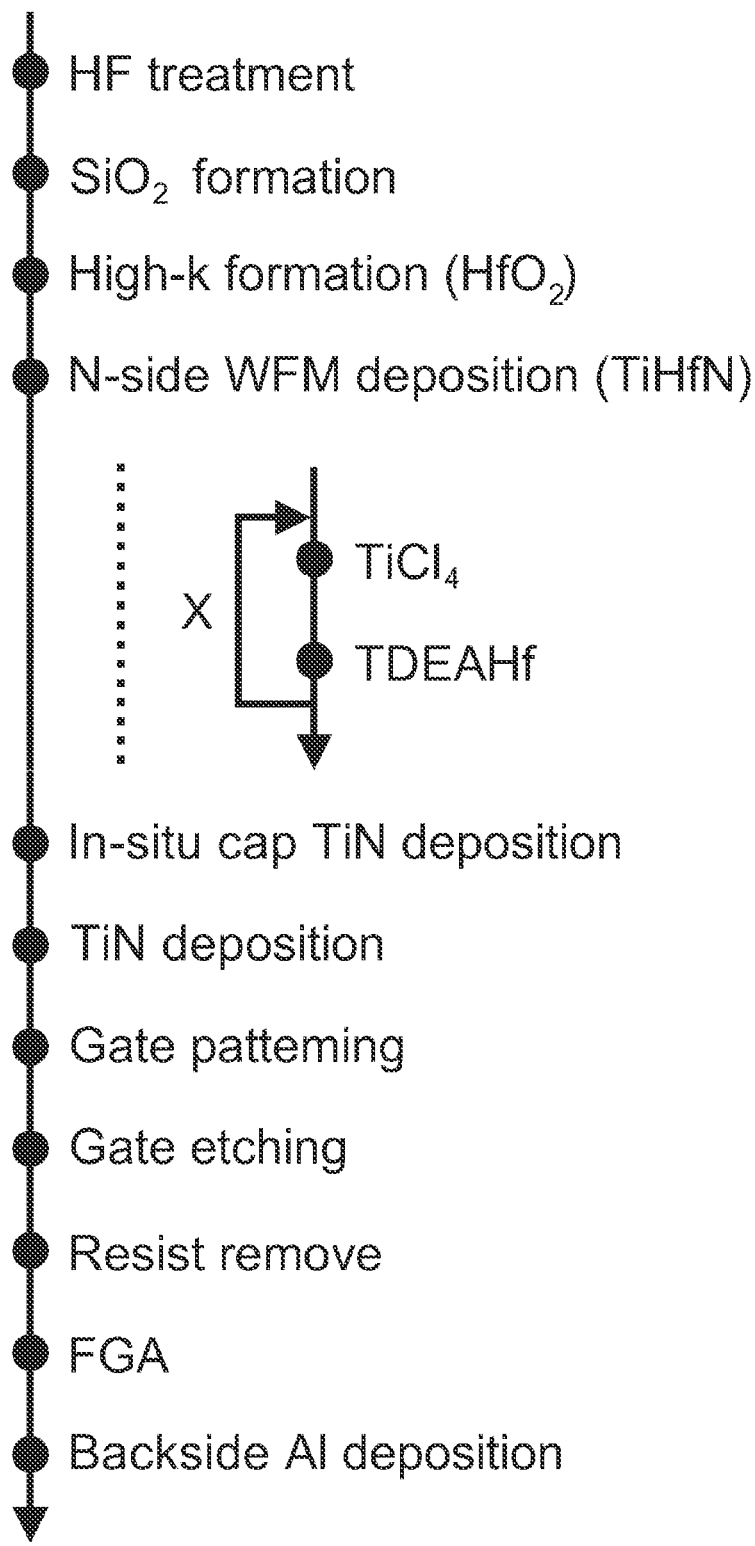
FIG. 5 is a flowchart of an example of a process of manufacturing the transistor gate of FIG. 4.

Next, an example of a process of manufacturing a transistor gate illustrated in FIG. 4 will be described. FIG. 5 is a flowchart of an example of a process of manufacturing the transistor gate of FIG. 4.

First, a sacrificial oxide film is removed from a silicon substrate by processing the silicon substrate, for example, with a 1% HF aqueous solution ('HF treatment' process). Then, a silicon oxide ($SiO_2$) film is formed on a surface of the silicon substrate by thermal oxidation ('$SiO_2$ formation' process). The $SiO_2$ film is formed as an interface layer at an interface between the silicon substrate and a hafnium oxide ($HfO_2$) film which will be formed thereafter.

Next, the $HfO_2$ film is formed as a high-k film on the $SiO_2$ film ('High-k formation' process). A gate insulating film includes the $SiO_2$ film and the $HfO_2$ film. Next, a composite metal nitride film is formed as a gate electrode on the $HfO_2$ film ('N-side WFM deposition' process). In the present embodiment, a titanium hafnium nitride film (TiHfN) is formed as the composite metal nitride film. As illustrated in FIG. 5, the first source ($TiCl_4$) and the second source (TDEAHf) are alternately supplied in X cycles in this process.

Then, a titanium nitride film (TiN) is formed in-situ as a capping layer on the TiHfN film ('in-situ cap TiN deposition' process). Also, the titanium nitride film (TiN) is formed by, for example, physical vapor deposition (PVD) ('TiN deposition' process). Then, patterning is performed on the TiN film using a resist as a mask by photolithography ('gate patterning' process) and pattern etching is performed by dry etching ('gate etching' process). Then, the resist is removed ('resist remove' process). Then, forming gas annealing (FGA) such as hydrogen gas annealing is performed ('FGA' process). Thereafter, an aluminum layer is formed on a back surface of the silicon substrate ('backside Al deposition' process).

Processes of Forming TiHfN Film and TiN Film

Next, a process of forming the composite metal nitride film (TiHfN) of the gate electrode described above and a process of forming the metal nitride film (TiN film) of the capping layer will be described below. These processes are performed in the process chamber 101 of the substrate processing apparatus described above.

Figure 6:
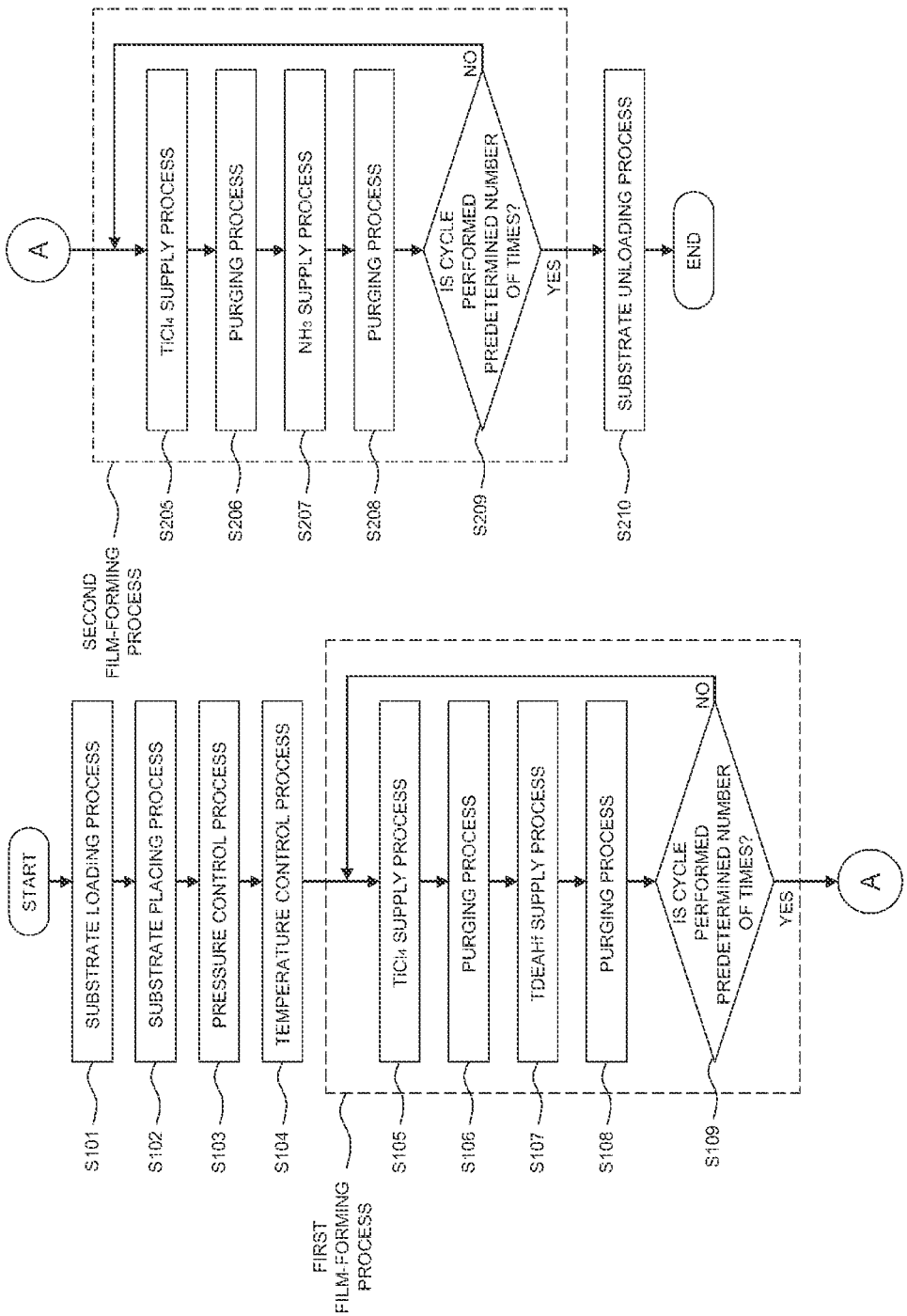
FIG. 6 is a flowchart of an example of a process of forming a composite metal nitride film and a process of forming a metal nitride film, which are included in the flowchart of FIG. 5.
Figure 7:
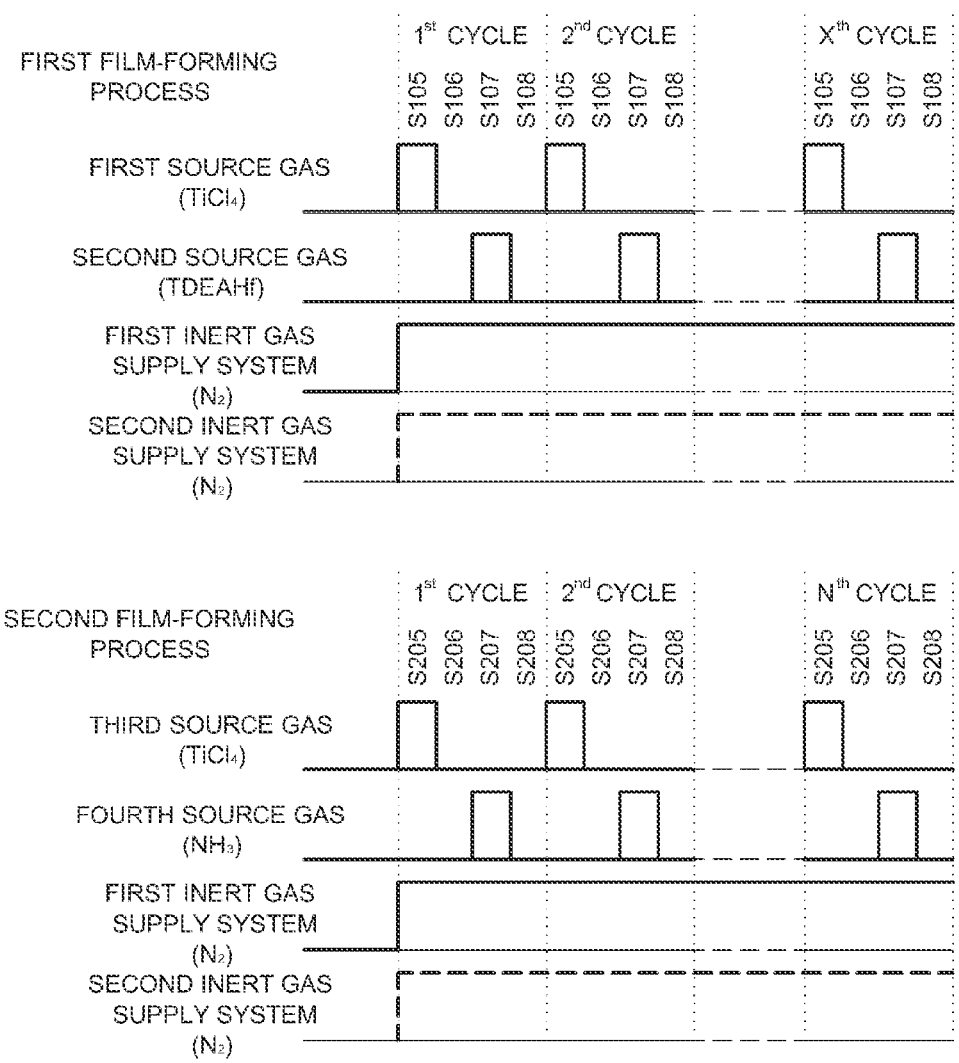
FIG. 7 illustrates gas supply timing in the processes of FIG. 6.

FIG. 6 is a flowchart of an example of the process of forming the composite metal nitride (TiHfN) film and the process of forming the metal nitride (TiN) film, which are included in the flowchart of FIG. 5. FIG. 7 illustrates gas supply timing in the processes of FIG. 6. In the following description, operations of various components of the substrate processing apparatus are controlled by the controller 300.

When the term 'wafer' is used in the present disclosure, it should be understood as either the wafer itself, or both the wafer and a stacked structure (assembly) including a layer/film formed on the wafer (i.e., the wafer and the layer/fifth formed thereon may also be referred to collectively as the 'wafer'). Also, when the expression 'surface of the wafer' is used in the present disclosure, it should be understood as either a surface (exposed surface) of the wafer itself or a surface of a layer/film formed on the wafer, i.e., an uppermost surface of the wafer as a stacked structure.

Thus, in the present disclosure, the expression 'specific gas is supplied onto a wafer' should be understood to mean that the specific gas is directly supplied onto a surface (exposed surface) of the wafer or that the specific gas is supplied onto a layer/film on the wafer, i.e., the uppermost surface of the wafer as a stacked structure. Also, in the present disclosure, the expression 'layer or film is formed on a wafer' should be understood to mean that the layer or film is directly formed on a surface (exposed surface) of the wafer or that the layer or film is formed on a layer or film formed on the wafer, i.e., the uppermost surface of the wafer as a stacked structure.

In the present disclosure, the term 'substrate' has the same meaning as the term 'wafer,' Thus, the term 'wafer' may be used interchangeably with the term 'substrate.'

Substrate Loading Process (S101)

First, the gate valve 151 installed on the wafer transfer port 150 is opened to transfer the wafer 100 from the transfer chamber 171 into the process container 102 using the transfer robot 173. The high-k film ($HfO_2$) described above is formed on the wafer 100. In addition to $HfO_2$, the high-k film may include at least one film selected from the group consisting of aluminum oxide (AlO), zirconium oxide (ZrO), lanthanum oxide (LaO), yttrium oxide (YO), tantalum oxide (TaO), cerium oxide (CeO), titanium oxide (TiO), strontium titanium oxide (STO) and barium titanium oxide (BTO). The high-k film may further include not only the at least one film but also silicon oxide (SiO) or silicon nitride (SiN).

Substrate Placing Process (S102)

The wafer 100 transferred into the process container 102 is placed on the lifter pins 108b. Then, the support 103 is moved up to the wafer processing position, so that the wafer 100 may be placed on the susceptor 117.

Pressure Control Process (S103)

After the wafer 100 is placed on the susceptor 117, the gate valve 151 is closed and the inside of the process chamber 101 is vacuum-exhausted by the vacuum pump 164 to have a desired pressure (degree of vacuum). In this case, the pressure in the process chamber 101 is measured by a pressure sensor (not shown) and is feedback controlled to the APC valve 162.

Temperature Control Process (S104)

Also, the wafer 100 placed on the susceptor 117 is heated to a predetermined temperature by the heater 106 embedded in the support 103. In this case, the amount of electric power supplied to the heater 106 is feedback controlled based on temperature information sensed by a temperature sensor (not shown), so that the wafer 100 may have a predetermined temperature distribution.

The pressure control and the temperature control described above are continuously performed until a first film-forming process and a second film-forming process which will be described below end.

Next, the first film-forming process of forming a TiHfN film which is a composite metal nitride film is performed by alternately supplying $TiCl_4$ and TDEAHf to the wafer 100. In the first film-forming process, the following four steps are sequentially performed.

First Film-Forming Process (TiHfN Film-Forming Process)

Step S105

In step S105, $TiCl_4$ (first source) is supplied into the process chamber 101. In detail, the valve 293d of the gas supply pipe 232d is opened to supply $TiCl_4$ to the vaporizer 270d. In this case, the flow rate of the $TiCl_4$ supplied to the vaporizer 270d is controlled by the LMFC 295d. At the same time, the valve 272d of the gas supply pipe 271d is opened to supply $N_2$ gas to the vaporizer 270d. The flow rate of the $N_2$ gas supplied to the vaporizer 270d is controlled by the MFC 273d. $TiCl_4$ gas vaporized by the vaporizer 270d is supplied into the process chamber 101 with the $N_2$ gas supplied as a carrier gas to the vaporizer 270d via the gas filter 281d and the gas inlet 110. In this process, the valve 233a may be opened to supply $N_2$ gas via the gas supply pipe 232a (first inert gas supply system). Also, the valve 233g may be opened to supply $N_2$ gas via the gas supply pipe 232g (second inert gas supply system).

In this process, the APC valve 162 is appropriately controlled to adjust a pressure in the process chamber 101 to be, for example, in a range of 20 Pa to 1,330 Pa. The supply flow rate of the $TiCl_4$ gas controlled by the LMFC 295d is set to be, for example, in a range of 10 ccm to 100 ccm. Also, the flow rate of the $N_2$ gas supplied together with the supply of the $TiCl_4$ gas is set to be, for example, in a range of 0 ccm to 200 ccm. A time duration of exposing the wafer 100 to the $TiCl_4$ gas, i.e., a gas supply time (irradiation time), is set to be, for example, in a range of 0.01 to 300 seconds. In this case, the temperature of the heater 106 is set such that the temperature (process temperature) of the wafer 100 is, for example, in a range of 300° C. to 350° C., and preferably, a range of 330° C. to 350° C. When the $TiCl_4$ gas is supplied, a Ti-containing layer is formed on the wafer 100 to, for example, a thickness of less than one atomic layer to several atomic layers.

Step S106

In step S106, the valve 233d is closed to stop the supply of the $TiCl_4$ gas into the process chamber 101. In this case, the inside of the process chamber 101 is vacuum-exhausted by the vacuum pump 164 while the APC valve 162 is open to remove the $TiCl_4$ gas (that did no react or that has contributed to the formation of the Si-containing layer) remaining in the process chamber 101 from the process chamber 101. Also, in this case, $N_2$ gas is supplied into the process chamber 101 by opening the valve 233a or 233g (or while the valve 233a or 233g is open). The $N_2$ gas may act as a purge gas and greatly increase an effect of removing the $TiCl_4$ gas (that did not react or that has contributed to the formation of the Ti-containing layer) from the process chamber 101. Purging is performed by supplying $N_2$ gas, for example, in a flow rate of 200 ccm for 1 to 60 seconds.

In this case, gases remaining in the process chamber 101 may not be completely removed and the inside of the process chamber 101 may not be completely purged. When a small amount of gases remains in the process chamber 101, a subsequent step S107 will not be negatively influenced by the gases. Also, the flow rate of the $N_2$ gas to be supplied into the process chamber 101 need not be high. For example, the inside of the process chamber 101 may be purged without causing step S107 to be negatively influenced by the gases by supplying an amount of the $N_2$ gas corresponding to the capacity of the process chamber 101. When the inside of the process chamber 101 is not completely purged, a purge time may be reduced to improve the throughput. Furthermore, the consumption of the $N_2$ gas may be reduced to a necessary minimum level.

Step S107

In step S107, TDEAHf (second source) is supplied into the process chamber 101. In detail, the valve 293e of the gas supply pipe 232e is opened to supply TDEAHf into the vaporizer 270e. In this case, the flow rate of the TDEAHf supplied into the vaporizer 270e is controlled by the LMFC 295e. At the same time, the valve 272e of the gas supply pipe 271e is opened to supply $N_2$ gas into the vaporizer 270e. The flow rate of the $N_2$ gas supplied into the vaporizer 270e is controlled by the MFC 273e. The TDEAHf gas vaporized by the vaporizer 270e is supplied into the process chamber 101 with the $N_2$ gas supplied as a carrier gas to the vaporizer 270e via the gas filter 281e and the gas inlet 110. In this process, the valve 233a may be opened to supply $N_2$ gas via the gas supply pipe 232a, similar to step S105. Also, the valve 233g may be opened to supply $N_2$ gas via the gas supply pipe 232g.

In this case, the APC valve 162 is appropriately controlled to set a pressure in the process chamber 101 to be in, for example, a range of 20 Pa to 1,330 Pa. The supply flow late of the TDEAHf gas controlled by the LMFC 295e is set to be in, for example, a range of 10 ccm to 100 ccm. Also, the flow rate of the $N_2$ gas supplied together with the TDEAHf gas is set to be in, for example, a range of 0 ccm to 200 ccm. A time duration of exposing the wafer 100 to the TDEAHf gas, i e. a gas supply time (irradiation time) is set to be in, for example, a range of 0.01 to 300 seconds. In this case, the temperature of the heater 106 is set such that the temperature of the wafer 100 is in, for example, a range of 300° C. to 400° C., preferably, a range of 330° C. to 400° C., and more preferably, a range of 330° C. to 350° C. When the temperature of the wafer 100 exceeds 400° C., the TDEAHf gas is pyrolized and thus a film-forming rate increases and controllability decreases. Thus, an upper temperature limit of the wafer 100 is preferably set to be in the range described above. The TDEAHf gas supplied into the process chamber 101 reacts with at least a portion of the Ti-containing layer formed on the wafer 100 in step S105. Thus, a TiHfN layer containing Ti, Hf and N is formed. In detail, Cl (halogen element) contained in the Ti-containing layer reacts with ethyl which is a ligand of amine contained in the TDEAHf gas and is thus removed from the Ti-containing layer. At the same time, the Ti-containing layer from which Cl is removed is combined with Hf and N contained in the TDEAHf gas to form a TiHfN layer.

Step S108

In step S108, the valve 233*e* is closed to stop the supply of the TDEAHf gas into the process chamber 101. In this case, the inside of the process chamber 101 is vacuum-exhausted by the vacuum pump 164 while the APC valve 162 is open to remove the TDEAHf gas (that did not react or that has contributed to the formation of an HfN-containing layer) remaining in the process chamber 101 from the process chamber 101. In this case, $N_2$ gas is continuously supplied into the process chamber 101 by opening the valve 233*a* or 233*g* (or while the valve 233*a* or 233*g* is open). The $N_2$ gas may act as a purge gas and greatly increase an effect of removing the TDEAHf gas (that did not react or that has contributed to the formation of the HfN-containing layer) from the process chamber 101. Purging is performed by supplying gas, for example, in a flow rate of 200 ccm for 1 to 60 seconds.

In this case, similar to step S106, gases remaining in the process chamber 101 may not be completely removed and the inside of the process chamber 101 may not be completely purged.

Step S109

One cycle including steps S105 to S108 described above is performed at least once (step S109). Thus, a composite metal nitride film containing titanium, hafnium and nitrogen, i.e., a TiHfN film, is formed. The above cycle is preferably repeatedly performed a plurality of times. Thus, the TiHfN film is formed on the high-k film on the wafer 100 to a predetermined thickness. Although the $TiCl_4$ gas is supplied prior to the supply of the TDEAHf gas in the present embodiment, the TDEAHf gas may be supplied prior to the supply of the $TiCl_4$ gas.

After the TiHfN film is formed, $N_2$ gas is supplied into the process chamber 101 by opening the valve 233*a* of the inert gas supply pipe 232*a* or the valve 233*g* of the inert gas supply pipe 232*g* (or while the valve 233*a* or 233*g* is open). The $N_2$ gas acts as a purge gas and purges the inside of the process chamber 101 to remove a gas remaining in the process chamber 101 from the process chamber 101. Then, a second film-forming process is performed to form a TiN film as a capping layer on the TiHfN film. The second film-forming process is performed in the process chamber 101 after the first film-forming process is performed.

Second Film-Forming Process (TiN Film-Forming Process)

Step S205

In step S205, $TiCl_4$ (third source) is supplied into the process chamber 101. The process of supplying the $TiCl_4$ (including opening/closing valves, etc.) is the same as that in step S105 described above and is not redundantly described here.

In this case, the APC valve 162 is appropriately controlled to set a pressure in the process chamber 101 to be in, for example, a range of 20 Pa to 1,330 Pa. The supply flow rate of the $TiCl_4$ gas controlled by the LMFC 295*d* is set to be in, for example, a range of 10 ccm to 100 ccm. Also, the flow rate of an inert gas such as $N_2$ gas supplied together with the $TiCl_4$ gas is set to be in, for example, a range of 0 ccm to 200 ccm. A time duration of exposing the wafer 100 to the $TiCl_4$, i.e., a gas supply time (irradiation time) is set to be in, for example, a range of 0.01 to 300 seconds. In this case, the temperature of the heater 106 is set such that the temperature of the wafer 100 is in, for example, a range of 100° C. to 400° C., preferably, a range of 200° C. to 400° C., and more preferably, a range of 240° C. to 350° C. When the $TiCl_4$ gas is supplied, a Ti-containing layer is formed on the TiHfN film formed in the first film-forming process to a thickness of, for example, less than one atomic layer to several atomic layers.

Step S206

Next, in step S206, the $TiCl_4$ gas is purged. The process of purging the $TiCl_4$ gas (including opening/closing valves, etc.) is the same as that in step S106 described above and is not redundantly described here. Similarly, the process of purging the $TiCl_4$ gas is performed by supplying $N_2$ gas, for example, in a flow rate of 20 ccm for 1 to 600 seconds.

Step S207

In step S207, $NH_3$ (fourth source) is supplied into the process chamber 101. In detail, the valve 233*b* of the gas supply pipe 232*b* is opened to supply $NH_3$ gas into the gas supply pipe 232*b*. The flow rate of the $NH_3$ gas flowing through the gas supply pipe 232*b* is controlled by the MFC 235*b*. The flow rate-controlled gas is supplied into the process chamber 101 via the gas inlet 110. In this process, the valve 233*a* may be opened to supply $N_2$ gas via the gas supply pipe 232*a*. Also, the valve 233*g* may be opened to supply $N_2$ gas via the gas supply pipe 232*g*.

In this case, the APC valve 162 is appropriately controlled to set a pressure in the process chamber 101 to be in, for example, a range of 20 Pa to 1,330 Pa. The supply flow rate of the $NH_3$ gas controlled by the MFC 235*b* is set to be in, for example, a range of 10 ccm to 200 ccm, and preferably, a range of 100 ccm to 200 ccm. A time duration of exposing the wafer 100 to the $NH_3$, i.e., a gas supply time (irradiation time) is set to be in, for example, a range of 0.01 to 300 seconds. In this case, the temperature of the heater 106 is set such that the temperature of the wafer 100 is in, for example, a range of 100° C. to 400° C., preferably, a range of 200° C. to 400° C., and more preferably, a range of 240° C. to 350°

C. The NH₃ gas supplied into the process chamber 101 reacts with at least a portion of the Ti-containing layer formed on the wafer 100 in step S205. Accordingly, the Ti-containing layer is nitridated to form a titanium nitride layer (TiN layer).

Step S208

In step S208, the valve 233b is closed to stop the supply of the NH₃ gas into the process chamber 101. In this case, the inside of the process chamber 101 is vacuum-exhausted by the vacuum pump 164 while the APC valve 162 is open to remove the NH₃ gas (that did not react or that has contributed to the formation of a nitrogen-containing layer) remaining in the process chamber 101 from the process chamber 101. Also, in this case, N₂ gas is continuously supplied into the process chamber 101 by opening the valve 233a or 233g for while the valve 233a or 233g is open). The N₂ gas may act as a purge gas and greatly increase an effect of removing the NH₃ gas (that did not react or that has contributed to the formation of the nitrogen-containing layer) from the process chamber 101. Purging is performed by supplying N₂ gas, for example, in a flow rate of 200 ccm for 1 to 60 seconds.

In this case, gases remaining in the process chamber 101 may not be completely removed and the inside of the process chamber 101 may not be completely purged, similar to the above purging processes.

Step S209

One cycle including steps S205 to S208 described above may be performed at least once to form a metal nitride film containing titanium and nitrogen, i.e., a TiN film (step S209). This cycle is preferably repeatedly performed a plurality of times. Thus, a TiN film is formed on the TiHfN film on the wafer 100 to a predetermined thickness (e.g., 4 nm). Although the TiCl₄ gas is supplied prior to the supply of the NH₃ gas in the present embodiment, the NH₃ as may be supplied prior to the supply of the TiCl₄ gas.

After the TiN film is formed, N₂ gas is supplied into the process chamber 101 by opening the valve 233a of the inert gas supply pipe 232a or the valve 233g of the inert gas supply pipe 232g (or while the valve 233a or 233g is open). The N₂ gas acts as a purge gas. The inside of the process chamber 101 is purged with an inert gas due to the N₂ gas to remove a gas remaining in the process chamber 101 from the chamber 101. Thereafter, an atmosphere in the process chamber 101 is replaced with the inert gas and the pressure in the process chamber 101 is regulated to be the same as that in the transfer chamber 171.

Step S210

Thereafter, the support 103 is moved down and the gate valve 151 is opened to unload the processed wafer 100 from the process container 102 by the transfer robot 173.

Figure 8:
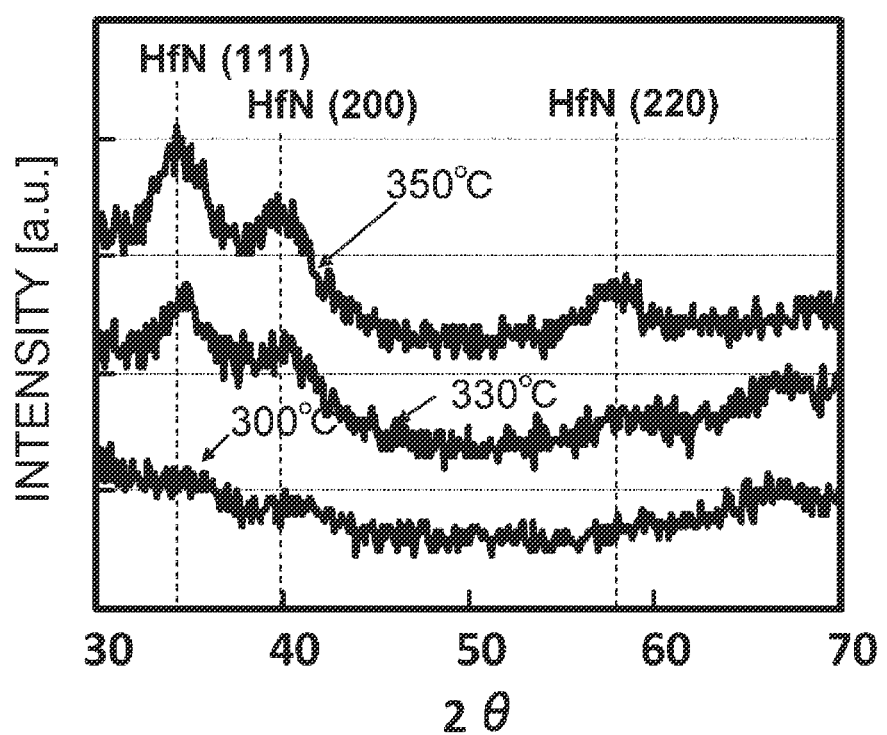
FIG. 8 is a graph showing the relationship between a process temperature and crystallinity when a TiHfN film is formed using TDEAHf.

FIG. 8 is a graph showing the relationship between a process temperature and crystallinity when a TiHfN film is formed using TDEAHf. FIG. 8 illustrates an analysis result of X-ray diffraction (XRD) on the MIN film when a process temperature is set to 300° C., 330° C. and 350° C. As illustrated in FIG. 8, a crystalline peak derived from HfN appears when the process temperature (film-forming temperature) is 300° C. and becomes higher when the process temperature is 330° C. or higher. As described above, a film having the crystallinity of HfN is formed when the TiHfN film is formed using TDEAHf at the process temperature ranging from 300° C. to 350° C. Here, the "film having the crystallinity of HfN" means a film including an Hf—N bond having a crystalline structure in which Hf and N are arranged regularly, i.e., a film in which a bond between Hf and N has crystallinity.

Figure 9:
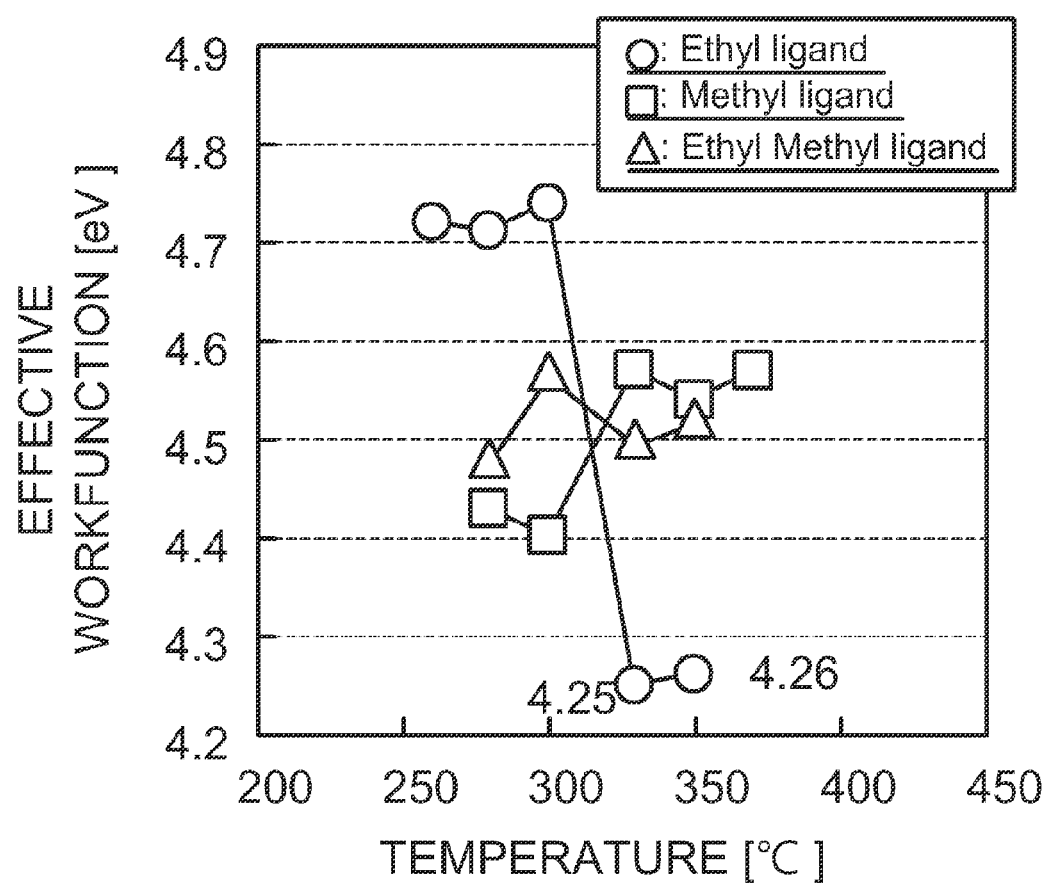
FIG. 9 is a graph showing the relationship between a work function and a process temperature of a gate formed according to the flowchart of FIG. 4.

FIG. 9 is a graph showing the relationship between a work function and a process temperature of a gate formed according to the flowchart of FIG. 4. In FIG. 9, "Ethyl ligand" denotes the relationship between a work function and a process temperature when a TiHfN film is formed using TDEAHf. As illustrated in FIG. 9, if TDEAHf containing an ethyl ligand is used to form a film, a work function sharply decreased when the process temperature exceeds 300° C. at which crystallinity (a crystalline structure) derived from HfN started to appear, and is extremely low at 330° C. or higher at which a sharp crystalline peak appeared. The above result is obtained because the work function of KIN (hafnium nitride) having crystallinity is lower than that of TiN, and should be understood to mean that the work function may be modulated to various levels by controlling the crystallinity of HfN. In detail, the work functions illustrated in FIG. 9 are effective work functions, and include a value of a dipole at an interface between HfO₂ and SiO₂ when HfO₂ is used to form a high-k film. When the work functions illustrated in FIG. 9 are achieved, a time duration of supplying TiCl₃ and a time duration of supplying TDEAHf per cycle are 2 seconds and 10 seconds, respectively.

A work function (execution work function) of the TiN film is about 4.8 eV to 4.9 eV when HfO₂ is used to form a high-k film. In this regard, a work function of a TiHfN film according to the present embodiment is sufficiently lower than that of a TiN film at a range of process temperatures at which crystallinity of HfN appeared. At 300° C. to 330° C. that are in the range of process temperatures, the work function of the TiHfN film sharply changed and may be thus preferably modulated to an arbitrary level in a range of work functions that are lower than the work function of the TiN film. Also, 330° C. to 350° C. are preferable since the work function of the TiHfN film may be modulated to be far lower than that of the TiN film.

In general, a work function of an NMOS type transistor is required to be lower than 4.5 eV. As illustrated in FIG. 9, the work function of the TiHfN film according to the present embodiment sufficiently satisfies the above requirement in a range of process temperatures (particularly, at 330° C. to 350° C.) at which the crystallinity of HfN appears. Also, when a film other than an HfO₂ film is used as a high-k film, the TiHfN film according to the present invention has a work function that is far lower than that of the TiN film and is preferably used as a metal gate electrode of an NMOS type transistor.

Here, the crystallinity and work function of a TiHfN film formed using a source that does not contain an ethyl ligand will be described.

Figure 10:
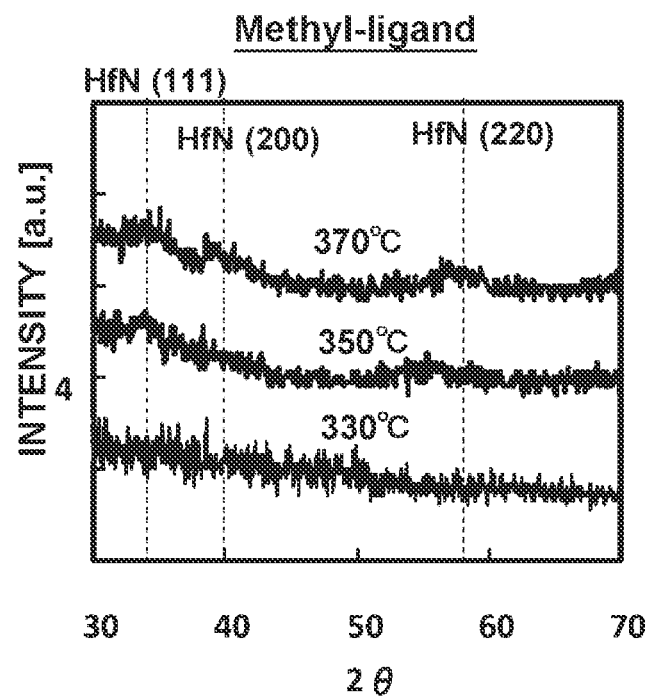
FIG. 10 is a graph showing the relationship between a process temperature and crystallinity when a TiHfN film is formed using TDMAHf.

FIG. 10 is a graph showing the relationship between a process temperature and crystallinity when a THEN film is formed using tetrakis(dimethylamino)hafnium that contains a methyl ligand (TDMAHf, Hf(N(CH₃)₂)₄). Here, process conditions such as the flow rate of gases, pressures, etc. are the same as those when the TiHfN film of FIG. 8 is formed using TDEAHf. As illustrated in FIG. 10, a crystalline peak derived from HfN did not distinctly appear when the TiHfN film is formed using TDMAHf containing a methyl ligand.

Figure 11:
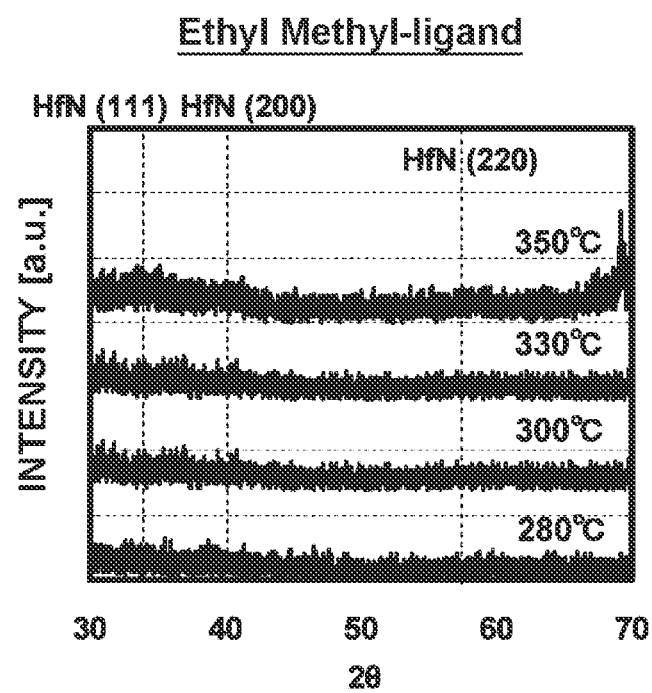
FIG. 11 is a graph showing the relationship between a process temperature and crystallinity when a TiHfN film is formed using TEMAHf.

FIG. 11 is a graph showing the relationship between a process temperature and crystallinity when a TiHfN film is formed using tetrakis(ethylmethyl amino)hafnium containing an ethylmethyl ligand (TEMAHf, Hf(N(C$_2$H$_5$)CH$_3$)$_4$). Here, process conditions such as the flow rate of gases, pressures, etc. are the same as those when the TiHfN film of FIG. 8 is formed using TDEAHf. As illustrated in FIG. 11, a crystalline peak derived from HfN did not distinctly appear when the TiHfN film is formed using TEMAHf containing an ethylmethyl ligand.

The reason why the crystallinity of HfN varied according to the type of a ligand is considered as follows. The binding energy between an ethyl ligand (C$_2$H$_5$) and nitrogen is lower than that between either a methyl ligand (CH$_3$) or an ethylmethyl ligand [(C$_2$H$_5$)CH$_3$] and nitrogen. Thus, separation of an ethyl ligand from TDEAHf may be promoted in the temperature range of about 300° C. to 350° C. described above to cause crystallinity derived from HfN to occur. Also, when a process temperature increased, a crystalline peak became sharper, since separation of the ethyl ligand is more promoted and the intensity of energy given when a film is formed is high to promote the crystalline growth of an Hf—N bond.

The relationship between a work function and a process temperature of a TiHfN film when the TiHfN film is formed using TDMAHf or TEMAHf is as illustrated in FIG. 9. In FIG. 9, "Methyl ligand" denotes a work function and a process temperature of a TiHfN film when the TiHfN film is formed using TDMAHf, and "Ethyl Methyl ligand" denotes a work function and process temperature of a TiHfN film when the TiHfN film is formed using TEMAHf. A work function of the TiHfN film is also modulated to a relatively large degree at 300° C. to 330° C. when TDMAHf or TEMAHf is used. However, the work function of the TiHfN film is higher and a range of modulation of the work function thereof is smaller than when TDEAHf is used. Also, even if in any cases, a process temperature increased to 330° C. or higher, the work function of the TiHfN film is not decreased unlike when TDEAHf is used. As described above, TDEAHf is preferably used to largely modulate a work function so that the work function may decrease.

Figure 12:
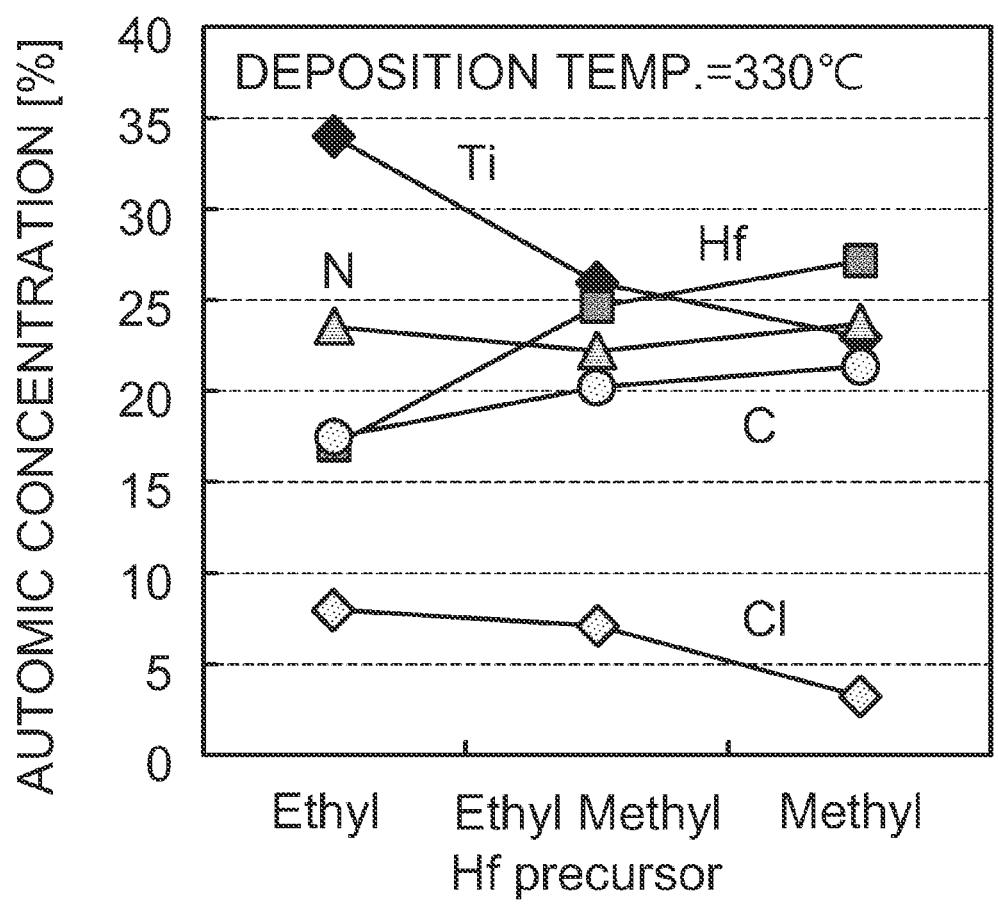
FIG. 12 is a graph showing the composition ratios of TiHfN films formed using TDEAHf, TDMAHf and TEMAHf.

FIG. 12 is a graph showing the composition ratios of TiHfN films formed using TDEAHf, TDMAHf and TEMAHf each containing Hf. In FIG. 12, "Ethyl" denotes the composition ratio of a TiHfN film formed using TDEAHf, "EthylMethyl" denotes the composition ratio of a TiHfN film formed using TEMAHf, and "Methyl" denotes the composition ratio of a TiHfN film formed using TDMAHf. All of the composition ratios illustrated in FIG. 12 are examples when a process temperature of the wafer 100 is 330° C. and process conditions such as the flow rates of gases and pressures are the same as those when the TiHfN films of FIGS. 8, 10 and 11 are formed. As illustrated in FIG. 12, the content of Hf or C that works to decrease a work function is lowest when TDEAHf is used. However, as illustrated in FIG. 12, a work function is lowest when TDEAHf is used, and is greatly decreased by the crystallinity of HfN. Also, referring to FIG. 12, the reason why the content of Hf is high when TDMAHf or TEMAHf is used is considered that pyrolysis temperatures of TDMAHf and TEMAHf are low.

Figure 13:
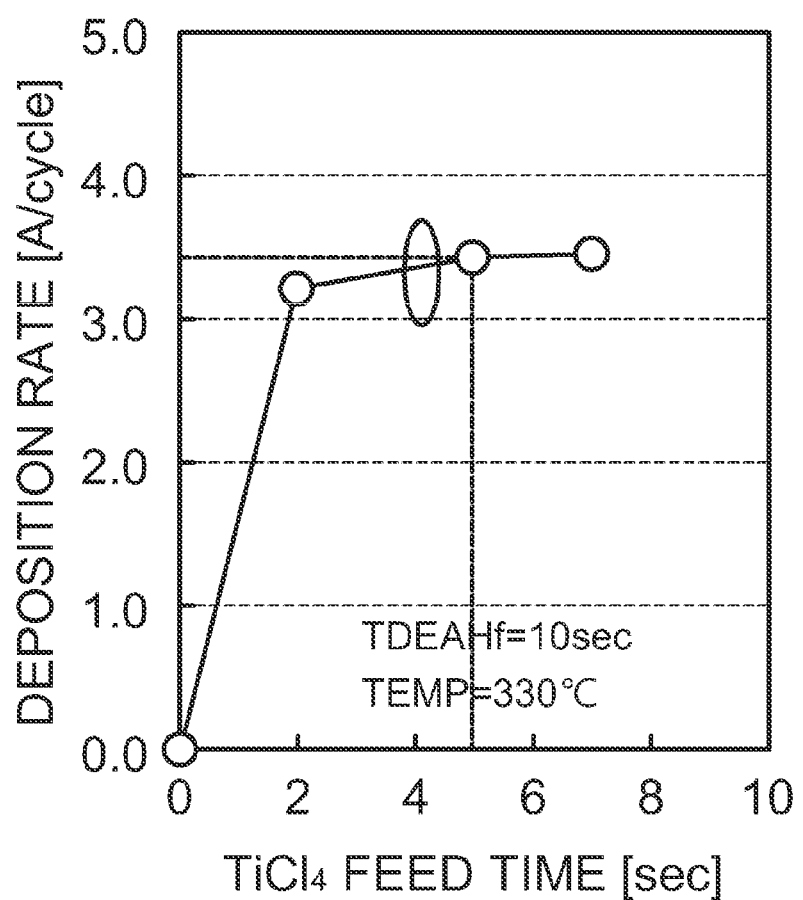
FIG. 13 is a graph showing the relationship between a time duration of $TiCl_4$ supply and a film-forming rate in the processes of FIG. 6.
Figure 14:
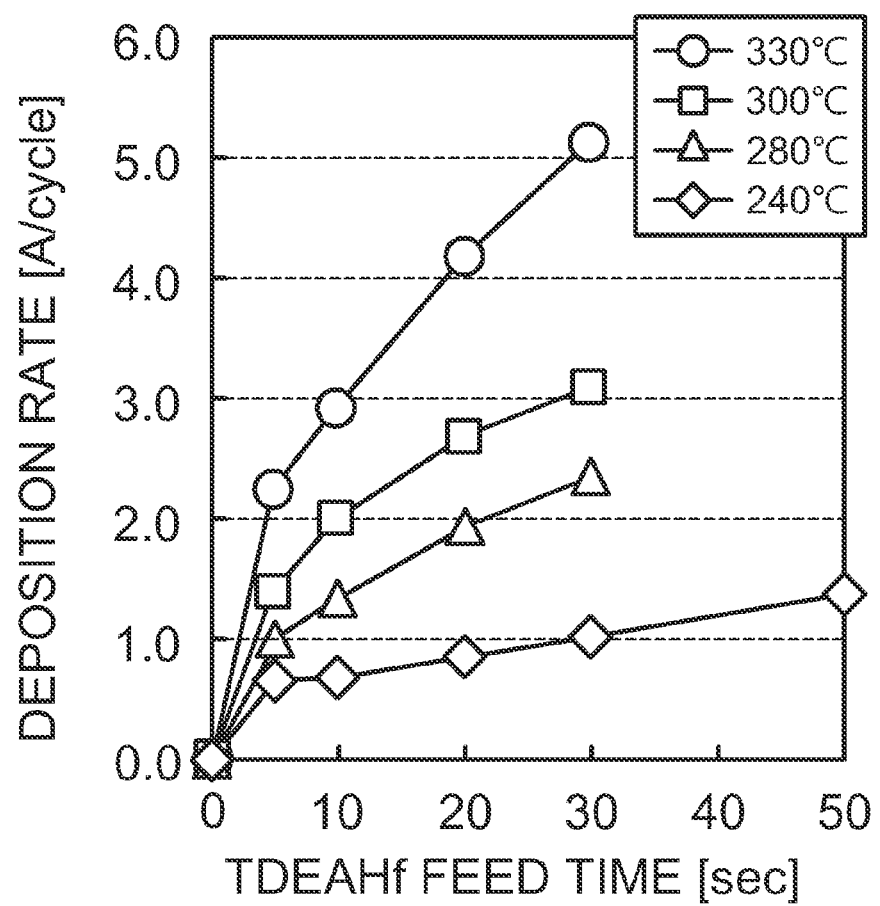
FIG. 14 is a graph showing the relationship between a time duration of TDEAHf supply and a film-forming rate in the processes of FIG. 6.

Next, reactions of various process gases in a process of forming the TiHfN film (the first film-forming process), will be described. FIG. 13 is a graph showing the relationship between a time duration of TiCl$_4$ supply and a film-forming rate in the first film-forming process described above. FIG. 14 is a graph showing the relationship between a time duration of TDEAHf supply and a film-forming rate in the first film-forming process described above.

As illustrated in FIG. 13, if TiCl$_4$ gas is supplied at a temperature that is in a range of process temperatures of the wafer 100 (330° C. in FIG. 13), a film-forming rate is at a critical point even when the time duration of supplying the TiCl$_4$ gas increased. That is, reaction of the TiCl$_4$ gas exhibited saturation characteristics in the range of temperatures of the wafer 100 described above. Thus, a film-forming rate increased in the range of process temperatures of the wafer 100 described above when the time duration of supplying TDEAHf gas increased as illustrated in FIG. 14. That is, reaction of the TDEAHf gas did not exhibit saturation characteristics in the range of process temperatures of the wafer 100 described above. Thus, in the above process of forming a TiHfN film, TiCl$_4$ showed a behavior of chemisorption but TDEAHf showed a behavior of chemical vapor growth. Accordingly, the time duration of supplying the TDEAHf gas may be controlled to adjust the content of FfN in (film thickness of) the TiHfN film, thereby effectively modulating a work function.

As described above, according to the present embodiment, a composite metal nitride film in which a bond between a second metal element and a nitrogen element has crystallinity may be formed on the wafer 100 by alternately supplying a first source containing a first metal element and a second source containing an ethyl ligand and the second metal element different from the first metal element to the wafer 100 while heating the wafer 100, thereby forming a metal film, the modulation width of the work function of which is high. When noble materials are employed in the existing production lines, integration problems (processing, thermal stability, diffusion stability, etc.) may occur. However, since a film-forming process according to the present embodiment is based on the process of forming a TiN film which is a metal nitride film according to the related art, integration problems may be prevented from occurring. Also, since a TiN film is formed as a capping film on a TiHfN film in si-tu, the oxidation resistance of the TiHfN film may be improved and a work function may be prevented from increasing due to oxidation.

The present invention may be also accomplished, for example, by changing a process recipe by modifying a gas supply system of an existing substrate processing apparatus which performs a semiconductor device manufacturing process. In order to change the process recipe, a process recipe according to the present invention may be installed in the existing substrate processing apparatus via a telecommunication line or a recording medium storing the process recipe according to the present invention or the process recipe may be replaced with the process recipe according to the present invention by manipulating an I/O device of the existing substrate processing apparatus.

Also, although a case in which a work function is modulated to be lower than that of a TiN film has been described in the previous embodiment, a work function may be modulated to be higher than that of the TiN film by using a different source containing an ethyl ligand. For example, a property of an ethyl ligand that is easily separated may be used to cause a bond between other elements of a film to have crystallinity, and a work function may be increased based on characteristics of a crystalline structure of the film.

Although various exemplary embodiments of a film-forming technique according to the present invention have been described above, the present invention is not limited thereto. For example, in the present embodiment, a single-wafer apparatus has been described as an example of a substrate processing apparatus but the present invention is also applicable to a vertical processing apparatus capable of processing a plurality of wafers at a time.

According to the present invention, a work function of a metal film may be controlled.

Exemplary Embodiments of the Invention

Hereinafter, exemplary embodiments of the present invention are supplementarily noted.

Supplementary Note 1

According to an aspect of the present invention, there is provided a substrate processing apparatus including:

a process chamber configured to accommodate a substrate;

a first source supply system configured to supply a first source containing a first metal element into the process chamber;

a second source supply system configured to supply a second source into the process chamber, the second source containing an ethyl ligand and a second metal element that is different from the first metal element;

and a control unit configured to control the first source supply system and the second source supply system to form a composite metal nitride film on the substrate by alternately supplying the first source and the second source into the process chamber, wherein a bond between the second metal element and a nitrogen element in the composite metal nitride film formed on the substrate has crystallinity.

Supplementary Note 2

In the substrate processing apparatus of Supplementary note 1, the first metal element is a transition metal element.

Supplementary Note 3

In the substrate processing apparatus of Supplementary note 1, the second metal element is a transition metal element.

Supplementary Note 4

In the substrate processing apparatus of Supplementary note 1, the first metal element is titanium and the second metal element is hafnium.

Supplementary Note 5

In the substrate processing apparatus of Supplementary note 1, the first source is $TiCl_4$ containing titanium as the first metal element and the second source is TDEAHf containing hafnium as the second metal element.

Supplementary Note 6

In the substrate processing apparatus of Supplementary note 1, the control unit controls a heating unit to set a process temperature to be in a range of 330° C. to 350° C. during the forming of the composite metal nitride film.

Supplementary Note 7

In the substrate processing apparatus of Supplementary note 1, the first source exhibits a chemisorption reaction and the second source exhibits a chemical vapor growth reaction during the forming of the composite metal nitride film.

Supplementary Note 8

According to another aspect of the present invention, there is provided a method of manufacturing a semiconductor device, the method including a process of forming a composite metal nitride film on a substrate present in a process chamber by alternately supplying a first source and a second source to the substrate, wherein the first source contains a first metal element, the second source contains an ethyl ligand and a second metal element that is different from the first metal element, and a bond between the second metal element and a nitrogen element in the composite metal nitride film has crystallinity.

Supplementary Note 9

In the method of Supplementary note 8, the first source is $TiCl_4$ containing titanium as the first metal element and the second source is TDEAHf containing hafnium as the second metal element.

Supplementary Note 10

In the method of Supplementary note 8, a process temperature is in a range of 330° C. to 350° C. in the process of forming the composite metal nitride film.

Supplementary Note 11

In the method of Supplementary note 8, the first source exhibits a chemisorption reaction and the second source exhibits a chemical vapor growth reaction in the process of forming the composite metal nitride film.

Supplementary Note 12

According to still another aspect of the present invention, there is provided a program causing a computer to perform a sequence of forming a composite metal nitride film on a substrate present in a process chamber by alternately supplying a first source and a second source to the substrate, wherein the first source contains a first metal element, the second source contains an ethyl ligand and a second metal element that is different from the first metal element, and a bond between the second metal element and a nitrogen element in the composite metal nitride film has crystallinity.

Supplementary Note 13

According to another aspect of the present invention, there is provided a non-transitory computer-readable recording medium having recorded thereon a program causing a computer to perform a sequence of forming a composite metal nitride film on a substrate present in a process chamber by alternately supplying a first source and a second source to the substrate, wherein the first source contains a first metal element, the second source contains an ethyl ligand and a second metal element that is different from the first metal element, and a bond between the second metal element and a nitrogen element in the composite metal nitride film has crystallinity.

What is claimed is:

1. A method of manufacturing a semiconductor device, comprising:
   (a) supplying a first metal source including a first metal element and a halogen element to a substrate accommodated in a process chamber and exhausting the first metal source from the process chamber while heating the substrate to a temperature ranging from 300° C. to 350° C. to form on the substrate a first metal element-containing layer including the first metal element and the halogen element by a chemisorption reaction; and
   (b) supplying a second metal source including an ethyl ligand, nitrogen and a second metal element different from the first metal element to the substrate and exhausting the second metal source from the process chamber while heating the substrate to a temperature ranging from 300° C. to 350° C. to form on the substrate a composite metal nitride layer including the first metal element, the second metal element and nitrogen by a chemical vapor growth reaction between the first metal element-containing layer and the second metal source,
   wherein (a) and (b) are repeated a plurality of times to form on the substrate a composite metal nitride film including the first metal element, the second metal element and nitrogen with a bond between the second metal element and nitrogen having crystallinity.

2. The method of claim 1, wherein each of the first metal element and the second metal element is a transition metal selected from a group consisting of titanium, tungsten, tantalum, zirconium, hafnium, ruthenium, cobalt and nickel.

3. The method of claim 1, wherein a work function of the composite metal nitride film is controlled by adjusting a temperature of a substrate such that the work function of the composite metal nitride film is lower than that of the metal nitride film constituted by the first metal element and nitrogen.

4. The method of claim 1, further comprising:
   (c) supplying the first metal source to the substrate having the composite metal nitride film thereon and exhausting the first metal source from the process chamber; and
   (d) supplying a nitrogen-containing gas to the substrate and exhausting the nitrogen-containing gas from the process chamber,
   wherein (c) and (d) are repeated a plurality of times in order after forming the metal nitride film on the substrate to form a second metal nitride film including the first metal element and nitrogen directly on the composite metal nitride film.

5. A substrate processing apparatus, comprising:
   a process chamber configured to accommodate a substrate;
   a supply system configured to supply a first metal source including a first metal element and a halogen element, a second metal source including an ethyl ligand, nitrogen and a second metal element different from the first metal element into the process chamber;
   a heater configured to heat the process chamber;
   an exhaust system configured to exhaust the process chamber; and
   a controller configured to control the supply system, the heater and the exhaust system to perform:
   (a) supplying the first metal source into the process chamber accommodating the substrate and exhausting the first metal source from the process chamber while heating the substrate to a temperature ranging from 300° C. to 350° C. to form on the substrate a first metal element-containing layer including the first metal element and the halogen element by a chemisorption reaction; and
   (b) supplying the second metal source into the process chamber and exhausting the second metal source from the process chamber while heating the substrate to a temperature ranging from 300° C. to 350° C. to form on the substrate a composite metal nitride layer including the first metal element, the second metal element; and nitrogen by a chemical vapor growth reaction between the first metal element-containing layer and the second metal source,
   wherein (a) and (b) are repeated a plurality of times to form on the substrate a composite metal nitride film including the first metal element, the second metal element and nitrogen with a bond between the second metal element and nitrogen having crystallinity.

6. A non-transitory computer-readable recording medium storing a program causing a computer to perform:
   (a) supplying a first metal source including a first metal element and a halogen element to a substrate accommodated in a process chamber and exhausting the first metal source from the process chamber while heating the substrate to a temperature ranging from 300° C. to 350° C. to form on the substrate a first metal element-containing layer including the first metal element and the halogen element by a chemisorption reaction; and
   (b) supplying a second metal source including an ethyl ligand, nitrogen and a second metal element different from the first metal element to the substrate and exhausting the second metal source from the process chamber
   while heating the substrate to a temperature from 300° C. to 350° C. to form on the substrate a composite metal nitride layer including the first metal element, the second metal element and nitrogen by a chemical vapor growth reaction between the first metal element-containing layer and the second metal source,
   wherein (a) and (b) are repeated a plurality of times to form on the substrate a composite metal nitride film including the first metal element, the second metal element and nitrogen with a bond between the second metal element and nitrogen having crystallinity.

* * * * *